United States Patent [19]

Ahn

[11] Patent Number: 5,279,983
[45] Date of Patent: Jan. 18, 1994

[54] METHOD OF MAKING A SEMICONDUCTOR MEMORY DEVICE

[75] Inventor: Ji-hong Ahn, Seoul, Rep. of Korea

[73] Assignee: Samsung Electronics Co., Ltd., Kyunggi, Rep. of Korea

[21] Appl. No.: 906,376

[22] Filed: Jun. 30, 1992

[30] Foreign Application Priority Data

Jan. 6, 1992 [KR] Rep. of Korea ............... 92-52

[51] Int. Cl.$^5$ ............................................ H01L 21/70
[52] U.S. Cl. ........................................ 437/52; 437/47; 437/48; 437/60
[58] Field of Search ................ 437/47, 48, 52, 60, 437/195

[56] References Cited

U.S. PATENT DOCUMENTS 4,882,289 11/1989 Moriuchi et al. ............... 437/52
5,171,713 12/1992 Matthews ........................ 437/195

OTHER PUBLICATIONS

Kawanago, et al., "3-Dimensional Stacked Capacitor-Cell for 16M and 64M Drams", IEDM 1988, pp. 592-595.
Inoue, et al., "A New Stacked Capacitor Cell With Thin Box Structured Storage Node", Extended Abstracts of the 21st Conference on Solid State Devices and Materials, Tokyo, 1989, pp. 141-144.
Inoue, et al., "A Spread Stacked Capacitor (SSC) Cell for 64MBIT Drams", IEDM, 1989, pp. 31-34.
Wakamiya, et al., "Novel Stacked Capacitor Cell For 64Mb Dram", LSI R&D Laboratory, Mitsubishi Electric Corp., pp. 69-70.

Primary Examiner—Tom Thomas
Attorney, Agent, or Firm—Cushman, Darby & Cushman

[57] ABSTRACT

A semiconductor memory device includes a cell array region and a peripheral circuit region, wherein a channel is formed to surround the cell array region, on a border region between the cell array region and peripheral circuit region. Also, a method for the semiconductor memory device is provided. Therefore, the conventional problem of degraded reliability of the conductive layer due to the step between the cell array region and peripheral circuit region, can be prevented. At the same time, the surface planarization of the peripheral circuit region can be attained.

15 Claims, 5 Drawing Sheets

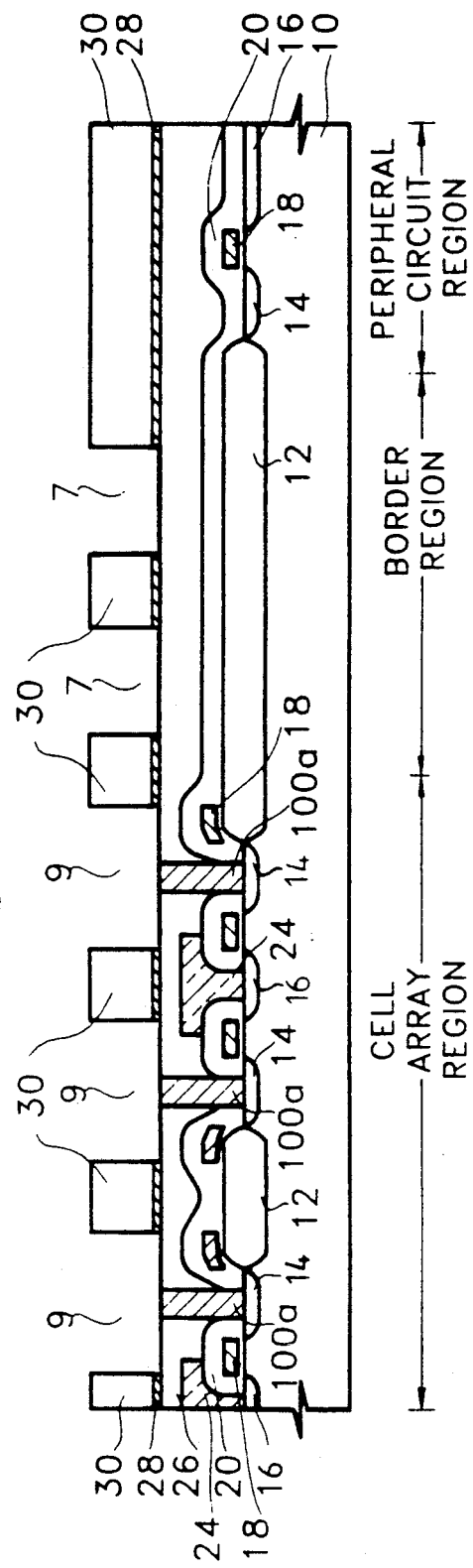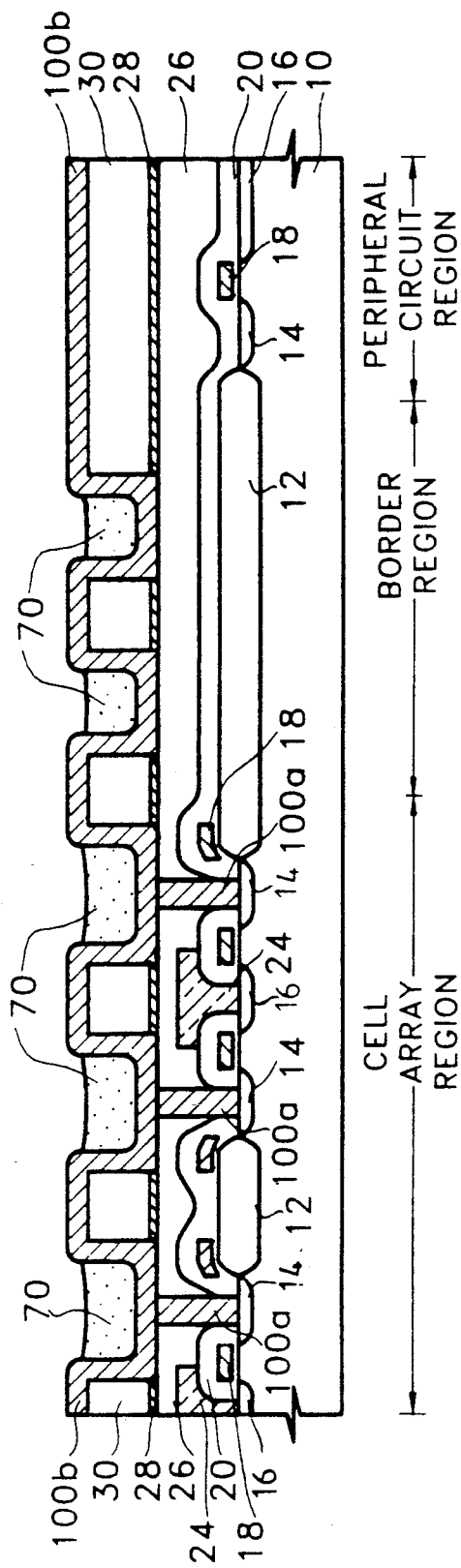

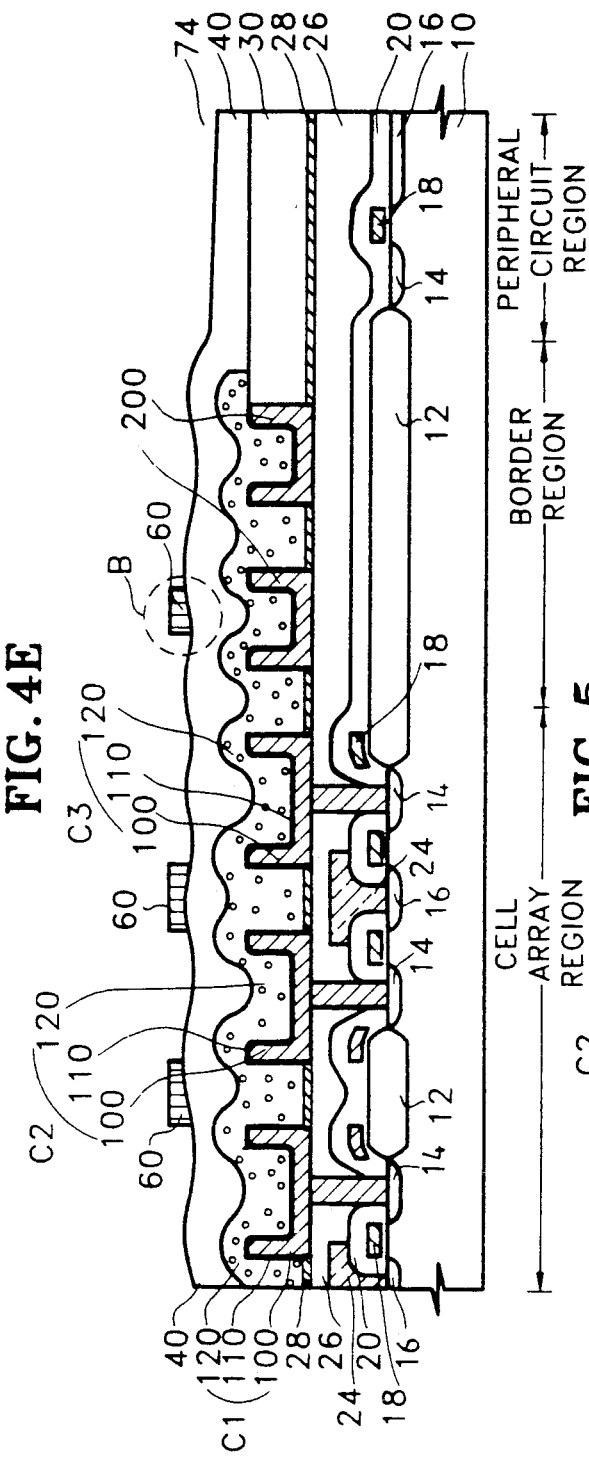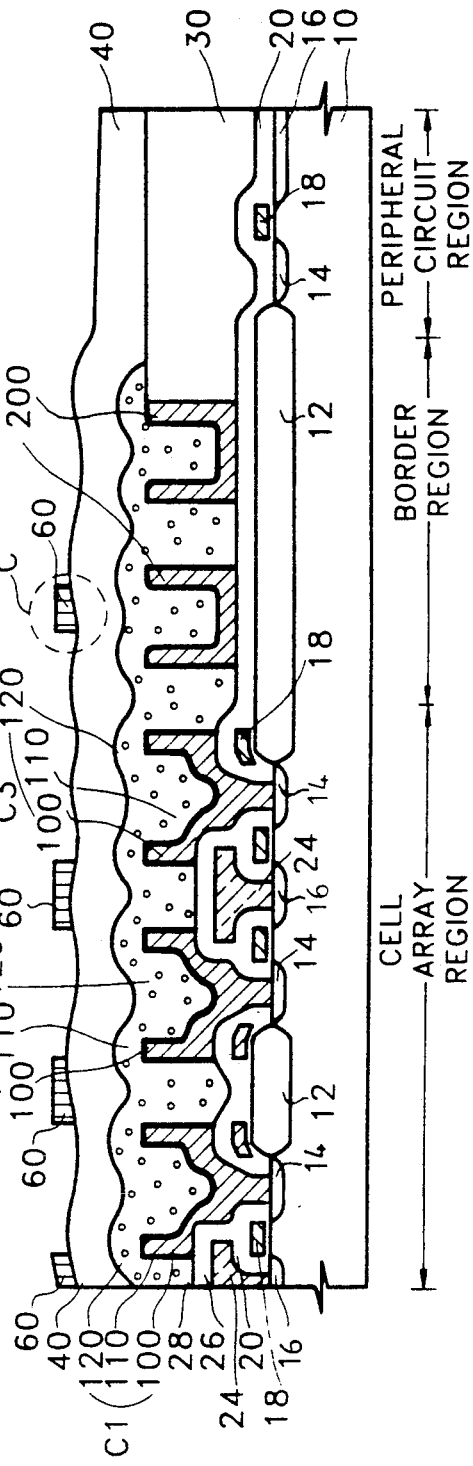

METHOD OF MAKING A SEMICONDUCTOR MEMORY DEVICE

BACKGROUND OF THE INVENTION

The present invention relates to a semiconductor memory device and manufacturing method thereof, and more particularly to a semiconductor memory device including a cell-array region and peripheral circuit region, and a method for manufacturing the same.

Decrease in cell capacitance caused by reduced memory cell area becomes serious improves the read-out capability and decreases the soft error rate in a DRAM memory cell, and therefore plays an important role in the improvement of cell memory characteristics. Due to the increase in packing density of memory cells, unit cell area per chip has decreased, which in turn reduces the area available for the cell capacitor. Therefore, the capacitance per unit area must be increased in tandem with increase in packing density.

Recently, many research reports have been published concerning increase in cell capacitance, most of them relating to the stacked structure of the cell capacitor's storage electrode. For example, they include: the fin-structured electrode ("3-dimensional Stacked Capacitor Cell for 16M and 64M" by T. Ema et al., IEDM 1988, pp. 592-595) of Fujitsu Co., the Box Structured electrode ("A New Stacked Capacitor Cell with Thin Box Structured Storage Node" by S. Inoue et al., Extended Abstracts of the 21st Conference on Solid State Devices and Materials, 1989, pp. 141-144) and SSC (Spread-Stacked Capacitor) Cell ("A Spread-Stacked Capacitor (SSC) Cell for 64 Mbit DRAMs" by S. Inoue et al., IEDM 1989, pp. 31-34) of Toshiba Co., and the cylindrical electrode ("Novel-stacked Capacitor Cell for 64 Mbit DRAMs" by W. Wakamiya et al., VLSI Technology Symposium, 1989, pp.69-70) of Mitsubishi Co.

These techniques for manufacturing a stacked capacitor constituting a DRAM have several advantages such as simple process, resistivity against alpha particles, easy increase of cell capacitance, etc. However, they have a fatal disadvantage in that they increase the step of a cell (i.e., the difference in heights from the surface of a semiconductor substrate to the topmost layer formed thereon after completing a cell). Such increase of the step of cell makes subsequent metallization processes difficult, particularly, on the border region between a cell array region and a peripheral circuit region.

FIG. 1 is a sectional view showing a conventional semiconductor memory device including a cell array region, a peripheral circuit region, and a border region between the cell array region and peripheral circuit region. The cell array region includes transistors which respectively consist of a source regions 14, drain regions 16, and gate electrodes 18, an insulating layer 20 for isolating the above gate electrode 18 from other conductive layers, a planarization layer 26, bit lines 24 in contact with each drain region 16, capacitors C1, C2 and C3. Each capacitor consists of a storage electrode 100, a dielectric film 110 and a plate electrode 120, with a portion thereof in contact with the source region of respective transistors. The peripheral circuit region includes several sense amplifiers as well as other elements constituting the peripheral circuitry shown here as one MOS transistor formed by source region 14, drain region 16 and gate electrode 18.

Among the above-described methods for easily increasing cell capacitance, the primary method employed is that for forming a cylindrical electrode. In the cylindrical capacitor, the outer surface as well as the inner surface are utilized as effective capacitor region for increasing cell capacitance. Accordingly, in order to increase the obtainable capacitance per unit area, the height of the cylinder is increased. However, referring to the sectional view of FIG. 1, it can be noted that the higher the cylinder (forming storage electrode 100) increases to obtain greater capacitance, the greater the step between the cell array region and peripheral region becomes. An increased step between the cell array region and peripheral circuit region causes several problems during subsequent metallization processes for forming a conductive layer 60; major problems among these are damage to the conductive layer pattern due to a notching phenomenon, the occurrence of stringers at the stepped corner, and the potential for shorts in the conductive layer (see circled portion A in FIG. 1).

SUMMARY OF THE INVENTION

Accordingly, it is an object of the present invention to provide a semiconductor memory device which enables reliable metallization by minimizing the step between the cell array region and peripheral circuit region.

It is another object of the present invention to provide a method suitable for manufacturing the semiconductor memory device.

To accomplish the above object of the present invention, there is provided a semiconductor memory device comprising a cell array region, a peripheral circuit region, and a border region between the cell array region and peripheral circuit region, wherein a channel surrounding the cell array region is formed on the border region.

Also, to accomplish another object of the present invention, there is provided a method for manufacturing a semiconductor memory device having a cell array region, a peripheral circuit region, and a border region between the cell array region and peripheral circuit region, comprising the steps of:

forming an insulating material layer on the whole surface of a semiconductor wafer;

forming a ditch surrounding the cell array region in the insulating material layer on the border region;

forming a channel composed of a first material inside the ditch; and removing the insulating material layer on the border region.

Here, the first material is either a conductive or non-conductive material. When the storage electrode of the capacitor on the cell array region and the channel are simultaneously formed, the first material is preferably a conductive material, e.g., a polysilicon doped with an impurity.

The channel may be formed by forming a first material layer by coating the first material on the whole surface of the insulating material layer having the ditch therein; filling the inside of the ditch in which the first material layer is already formed, with a second material; removing the first material layer except that inside the ditch by anisotropically etching the first material layer, using the second material as an etch-mask; and removing the second material and the insulating material layer.

At this time, any material can be used as the second material provided that the etch rate of the material differs from that of the first material with respect to an anisotropic and isotropic etching. For example, when the first material is a polysilicon doped with an impurity, a resist can be used as the second material.

The step for filling the inside of the ditch using a resist as the second material is carried out by covering the resist on the first material layer thicker than the depth of the ditch, and then etching-back the resist until the top surface of that part of the first material layer besides inside the ditch is exposed.

The insulating material layer can be removed by, after forming the channel, forming a resist layer on all portions excepting the border region, and then etching the insulating material layer, using the resist layer as an etch-mask.

In addition, to accomplish still another object of the present invention, there is provided a method for manufacturing a semiconductor memory device having a cell array region, a peripheral circuit region, and a border region between the cell array region and peripheral circuit region, comprising the steps of:

forming an insulating material layer on the whole surface of a semiconductor substrate;

forming a recess on the source region of a transistor constituting each cell, which is positioned above and larger than the source region on the cell array region, and forming a ditch surrounding the cell array region on the border region, by partially removing the insulating material layer;

forming a first material layer on the whole surface of the resultant structure, for forming a storage electrode;

filling the recess and ditch with a second material on the first material layer;

removing all of the first material layer except that inside the recess and ditch by anisotropically etching the first material layer, using the second material as an etch-mask;

removing the second material; and removing the insulating material layer on the cell array region and border region.

The insulating material layer on the cell array region and border region is removed such that a third material layer is formed on the whole surface of the obtained structure after removing the second material; a third material layer pattern is formed by partially removing the third material layer to expose the cell array region and a portion of the border region; and the insulating material layer on said cell array region and border region is removed, using the third material layer pattern as an etch-mask, and then the third material layer pattern is removed. Here, a photosensitive material having an etch rate different from the insulating material is preferable for the third material, e.g., a resist.

BRIEF DESCRIPTION OF THE DRAWINGS

The above objects and other advantages of the present invention will become more apparent by describing in detail the preferred embodiment of the present invention with reference to the accompanying drawings in which:

FIGS. 4A to 4E are sectional views illustrating the manufacturing method of the semiconductor memory device according to the present invention; and FIG. 5 is a sectional view illustrating one application of the method for manufacturing the semiconductor memory device according to the present invention.

DESCRIPTION OF THE PREFERRED EMBODIMENT

Figure 1:
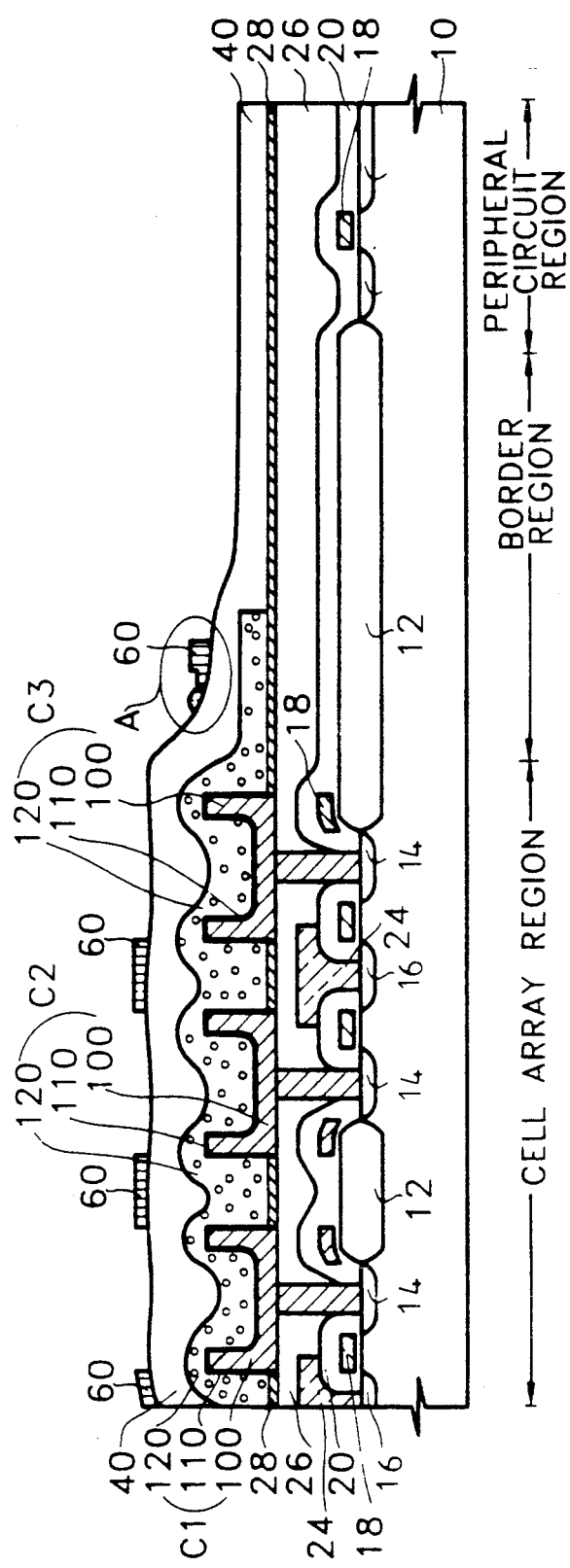
FIG. 1 is a sectional view showing a semiconductor memory device manufactured by a conventional method.

In the drawings, the same reference numerals used in FIG. 1 designate the similar portions hereinbelow.

Figure 2:
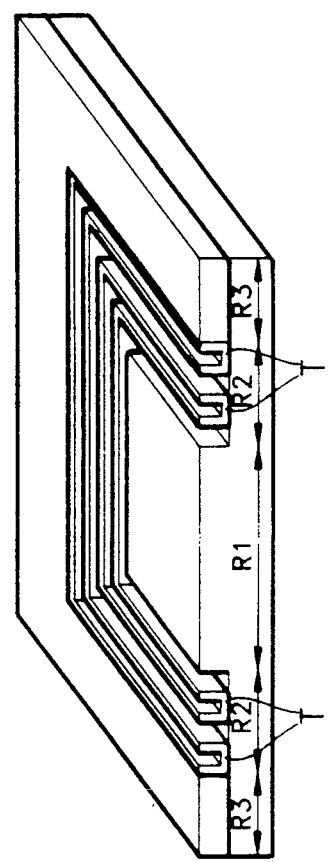
FIG. 2 is a schematic perspective view of intermediate product for illustrating a semiconductor memory device manufactured by a method according to the present invention.

FIG. 2 is a schematic perspective view of intermediate product for a semiconductor memory device manufactured by a method according to the present invention, wherein a cell array region R1, peripheral circuit region R3, and border region R2 between the cell array region and peripheral circuit region are illustrated. Also, a channel T is formed in border region R2 and surrounding cell array region R1.

Figure 3A:
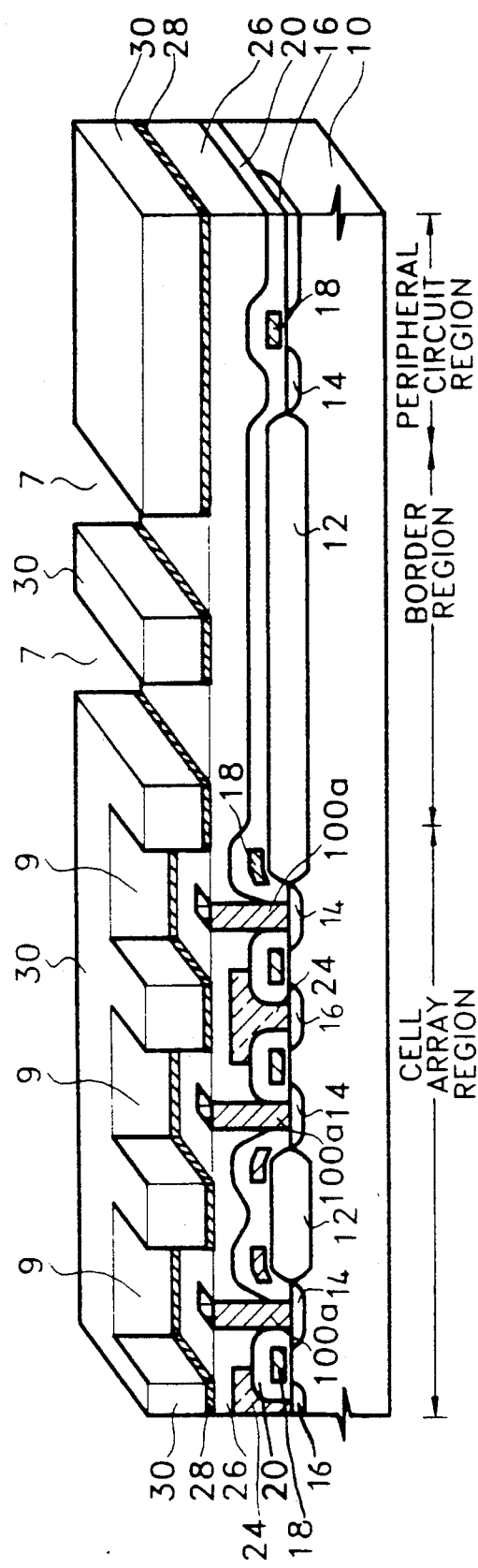
FIGS. 3A and 3B are perspective views of the semiconductor memory device for explaining the semiconductor memory device manufactured by the method according to the present invention.
Figure 3B:
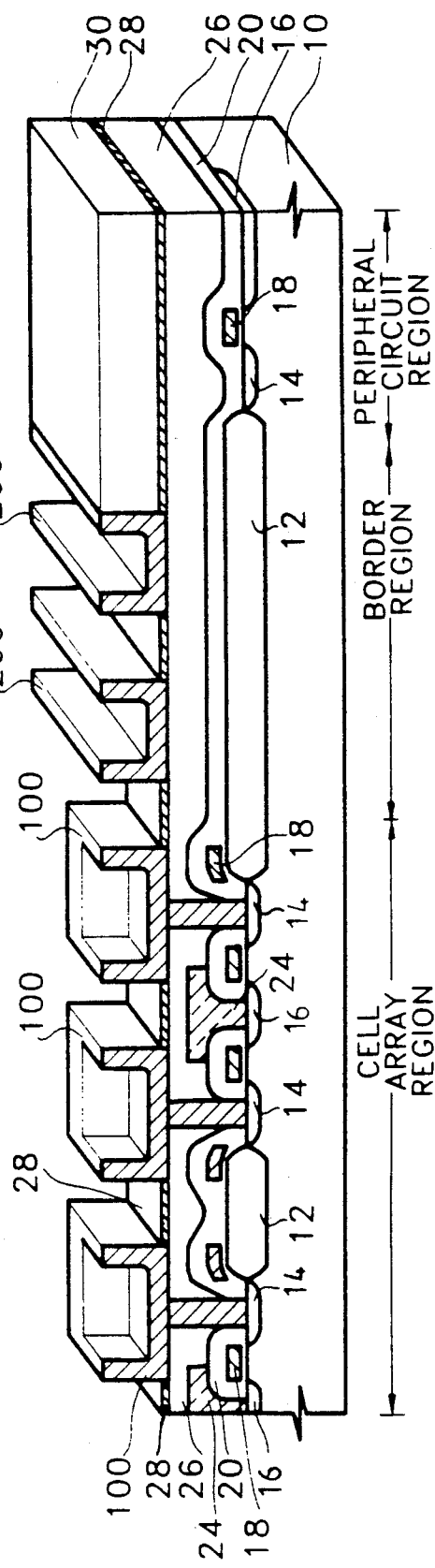

FIGS. 3A and 3B are perspective views of the semiconductor memory device for explaining the semiconductor memory device manufactured by the method according to the present invention.

The semiconductor memory device shown in FIG. 3A comprises a semiconductor substrate 10 divided into a cell array region, a peripheral circuit region, and a border region between the two. Here, the cell array region includes transistors each consisting of a source region 14, a drain region 16 and a gate electrode 18, and bit lines 24 in contact with drain regions 16. The peripheral circuit region has a transistor also consisting of a source region 14, a drain region 16, and a gate electrode 18. The border region has a field oxide layer 12 which separates the cell array region and peripheral circuit region. The semiconductor memory device further comprises a planarization layer 26; a pillar 100a which will help form storage electrodes and which are in contact with source region 14 of the transistor formed in the cell array region; an etch-blocking layer 28 (e.g., a silicon nitride layer) and an insulating material layer 30 which are stacked on the whole surface of the substrate having pillar 100a, and partially expose planarization layer 26; a recess 9 formed in the etch-blocking layer 28 and insulating material layer 30 while exposing pillar 100a and planarization layer 26 only on the cell array region; and a ditch 7 which surrounds the cell array region, for exposing planarization layer 26 formed in etch-blocking layer 28 and insulating material layer 30. This semiconductor memory device is manufactured during an intermediary process for forming a capacitor on the cell array region and channels on the border region.

FIG. 3B is a perspective view for illustrating the semiconductor memory device shown in FIG. 3A, which is subjected to the succeeding process. Here, cylindrical storage electrode 100 is formed on the cell array region by using the recess, and a channel 200 is formed on the border region by using the ditch 7.

FIGS. 4A to 4E are sectional views illustrating a manufacturing method of the semiconductor memory device according to the present invention.

First, FIG. 4A illustrates a process for forming a recess 9 used to form the storage electrode and for forming a ditch 7 used to form channels 200. A 3000 Å-7000 Å thick, an insulating material layer 30 such as boro-phosphor silicate glass (BPSG) layer is formed on the whole surface of the semiconductor substrate on which a lower structure is already formed. Here, the lower structure denotes the transistors constituting individual unit cells in the cell array region, and various devices constituting the peripheral circuitry in the peripheral circuit region. Thereafter, the insulating material layer is partially removed, so that a cylindrical recess 9 defined into an individual cell unit is formed over the source region of each transistor composing respective cells, to have an inside diameter of 3000-5000 Å which is larger than the source region and ditch 7 being 3000-5000 Å wide and surrounding the cell array region is formed on the border region. At this time, the ditch is preferably numbers more than one.

FIG. 4B illustrates a process for forming a first material layer 100b, and filling the recess and ditch with a second material 70. Here, a conductive material, e.g., a polycrystalline silicon, for forming the storage electrode is deposited as a first material on the whole surface of the semiconductor substrate in which the recess and ditch (designated by reference numerals 9 and 7, respectively, in FIG. 4A), thereby forming the first material layer 100b in a thickness of 500-1500 Å. Then, a second material 70, e.g., a photoresist, whose etch rate is different from the material consisting of the first material layer 100b with respect to an anisotropic or isotropic etching (mainly, wet-etching), is coated on the whole surface of the resultant structure obtained as above, thicker than the depths of the recess and ditch. Thereafter, the second material is solely etched-back until the topmost surface of the first material layer 100b is exposed, thereby filling the second material within just the recess and ditch.

Figure 4C:
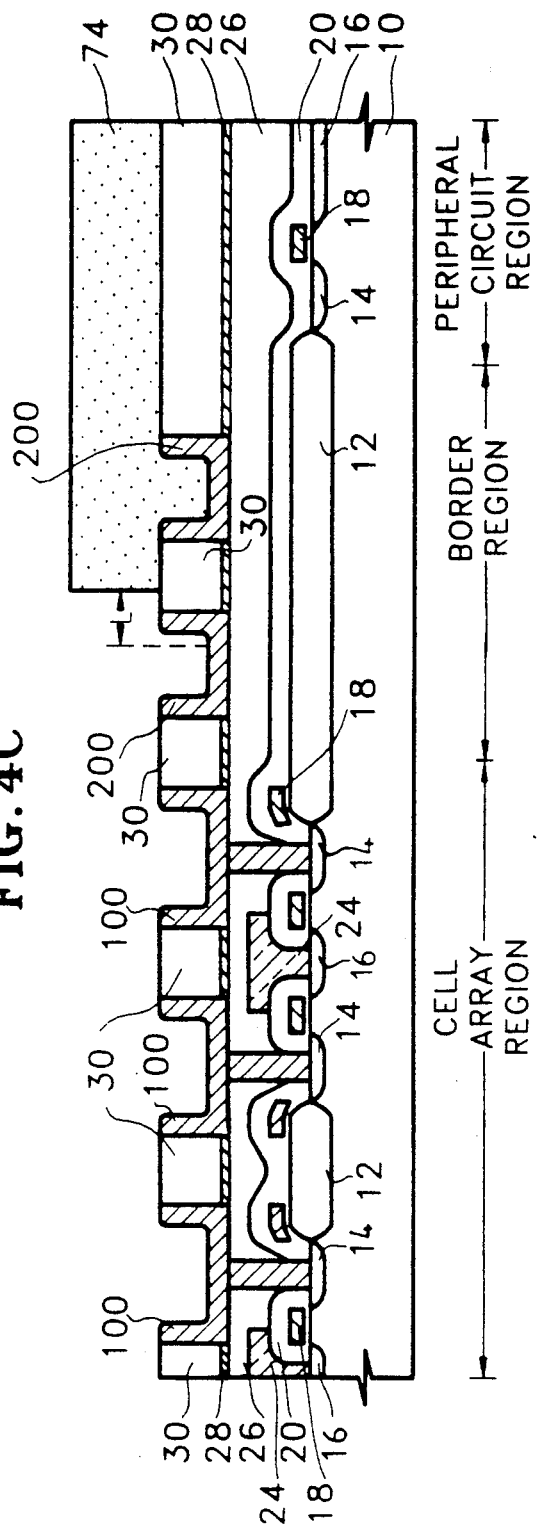

FIG. 4C illustrates a process for forming a cylindrical storage electrode 100, a channel 200, and a third material layer pattern 74. An anisotropic etching is carried out on the whole surface of the obtained structure, using the second material (reference numeral 70 of FIG. 4B) as an etch-mask, and the first material layer (reference numeral 100b of FIG. 4B) as an etched-object, so that storage electrode 100 being defined into an individual unit, is formed on the cell array region, and channel 200 surrounding the cell array region is formed in the border region. The overall height of the channel formed as above equals that of the storage electrode, and its thickness also equals that of the storage electrode. Successively, third material layer 74 is formed on the peripheral region and a portion of the border region, where third material layer 74 is preferably formed by using a photosensitive material, e.g., photoresist. After coating the photoresist, a resist pattern which is the third material layer 74 is formed by an exposure and development process. At this time, due to mask misalignment, the resist pattern may be slightly mismatched (by as much as the portion "L") with the desired pattern form.

Figure 4D:
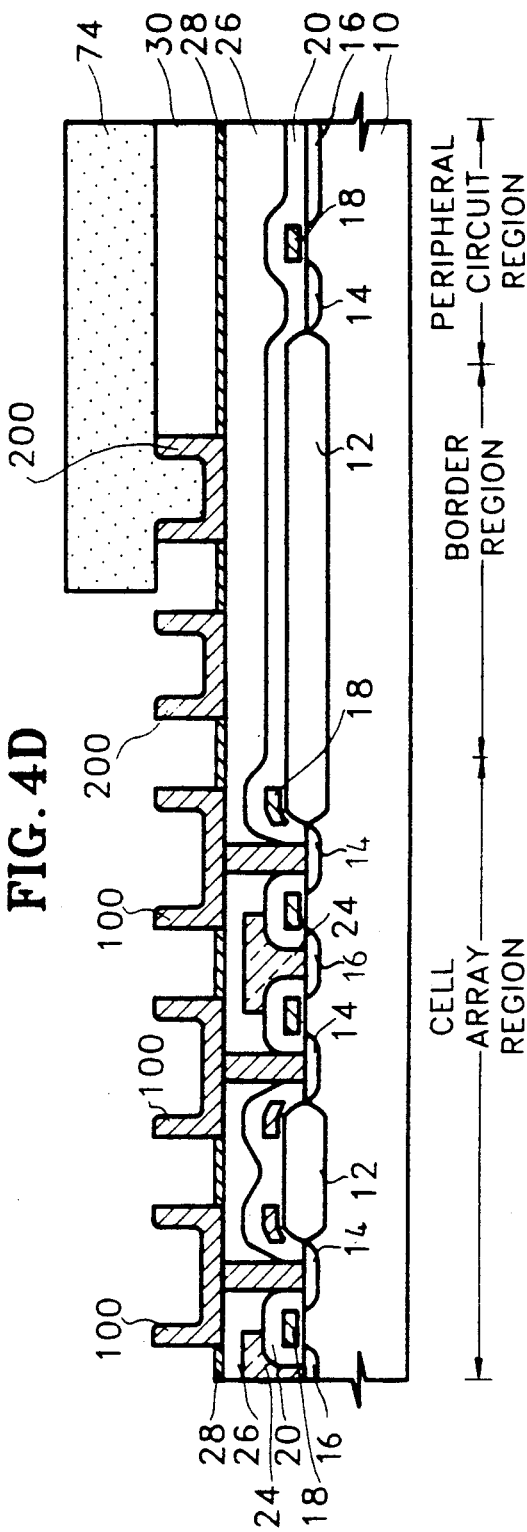

FIG. 4D illustrates a process for removing insulating material layer 30, wherein an isotropic etching (generally, wet-etching) is carried out on the whole surface of the obtained structure, using third material layer 74 as an etch-mask, and insulating material layer 30 as an etched-object, thereby removing insulating material layer 30. At this time, if the resist pattern is shortly formed in the direction of the peripheral circuit region due to the misalignment which may occur during the exposure for forming the resist pattern, the insulating material layer on the peripheral circuit region which must remain after performing the wet etching is removed, so that the object of the present invention cannot be accomplished. The reason for forming more than one ditch 7 in FIG. 4A is to prevent the above-described problem created by the misalignment of the mask pattern.

FIG. 4E illustrates a process for forming conductive layers 60. Here, a high dielectric material, e.g., a $Ta_2O_3$ or ONO layer, is deposited on the whole surface of storage electrode 100, thereby forming a dielectric film 110. Thereafter, a conductive material such as a polycrystalline silicon doped with an impurity is deposited on the whole surface of the obtained structure, and then patterned, so that a plate electrode 120 is formed. Then, an insulating material, e.g., BPSG, is coated over the whole surface of the obtained structure, thereby forming an insulating interlayer 40. Successively, a conductive layer 60 is formed by a conventional metallization process.

FIG. 5 is a sectional view for illustrating one application of the method for manufacturing semiconductor memory device according to the present invention. FIG. 5 depicts the fact that the object of the present invention can also be achieved when the capacitor is formed without performing a planarizing process, whereas FIGS. 4A to 4E show the case wherein a planarization layer (reference numeral 26) is formed to planarize the surface prior to forming the capacitor, and then the channel is formed.

Therefore, according to the semiconductor memory device according to the present invention, at least one channel is formed on the border region between the cell array region and peripheral circuit region, with the same material used to form the cell array, thereby minimizing the step generated at the border region. As a result, the degraded reliability of the conductive layer due to the step between the cell array region and peripheral circuit region which has been the problem of the conventional semiconductor memory device, can be prevented as can be seen in portion B of FIG. 4E and portion C of FIG. 5. Further, the surface-planarization of the peripheral circuit region is simultaneously achieved.

It will be apparent that many modifications and variations could be easily effected without departing from the spirit or scope of the novel concepts of the present invention.

What is claimed is:

1. A method for manufacturing a semiconductor memory device having a cell array region, a peripheral circuit region, and a border region between said cell array region and peripheral circuit region, comprising the steps of:

forming an insulating material layer on the whole surface of a semiconductor wafer;

forming a ditch surrounding said cell array region in said insulating material layer on said border region;

forming a channel composed of a first material inside said ditch; and removing said insulating material layer on said border region.

2. A method for manufacturing a semiconductor memory device as claimed in claim 1, wherein said first material is a conductive material.

3. A method for manufacturing a semiconductor memory device as claimed in claim 1, wherein said first material is a polysilicon doped with an impurity.

4. A method for manufacturing a semiconductor memory device as claim in claim 1, wherein said step for forming said channel comprises the steps of:
   forming a first material layer by coating said first material on the whole surface of said insulating material layer having said ditch therein;
   filling the inside of said ditch in which said first material layer is already formed, with a second material;
   removing said first material layer except that inside said ditch by anisotropically etching said first material layer, using said second material as an etch-mask; and
   removing said second material and said insulating material layer.

5. A method for manufacturing a semiconductor memory device as claimed in claim 4, wherein said second material is a resist.

6. A method for manufacturing a semiconductor memory device as claimed in claim 5, wherein said step for filling said ditch is carried out such that said resist is coated on said first material layer thicker than the depth of said ditch, and then is etched-back until the top surface of that part of said first material layer besides inside said ditch is exposed.

7. A method for manufacturing a semiconductor memory device as claimed in claim 1, wherein said step for removing said insulating material layer is carried out such that, after forming said channel, a resist layer is formed on all portions excepting said border region, and then said insulating material layer is etched using said resist layer as an etch-mask.

8. A method for manufacturing a semiconductor memory device having a cell array region, a peripheral circuit region, and a border region between said cell array region and peripheral circuit region, comprising the steps of:
   forming an insulating material layer on the whole surface of a semiconductor substrate;
   forming a recess on the source region of a transistor constituting each cell, which is positioned above and larger than said source region on said cell array region, and forming a ditch surrounding said cell array region on said border region, by partially removing said insulating material layer;
   forming a first material layer on the whole surface of the resultant structure, for forming a storage electrode;
   filling said recess and ditch with a second material on said first material layer;
   removing all of said first material layer except that inside said recess and ditch by anisotropically etching said first material layer, using said second material as an etch-mask;
   removing said second material; and
   removing said insulating material layer on said cell array region and border region.

9. A method for manufacturing a semiconductor memory device as claimed in claim 8, wherein said first material is a polycrystalline silicon doped with an impurity.

10. A method for manufacturing a semiconductor memory device as claimed in claim 8, wherein the number of said ditch is at least one.

11. A method for manufacturing a semiconductor memory device as claimed in claim 8, wherein said step for removing said insulating material layer on said cell array region and border region comprises the steps of:
   forming a third material layer on the whole surface of the obtained structure after removing said second material;
   forming a third material layer pattern by partially removing said third material layer to expose said cell array region and a portion of said border region; and
   removing said insulating material layer on said cell array region and border region, using said third material layer pattern as an etch-mask, and then removing said third material layer pattern.

12. A method for manufacturing a semiconductor memory device as claimed in claim 11, wherein said third material is a photosensitive material having an etch rate which is different from that of said insulating material layer with respect to a wet etching.

13. A method for manufacturing a semiconductor memory device as claimed in claim 12, wherein said third material is a photoresist.

14. A method for manufacturing a semiconductor memory device as claimed in claim 8, wherein a material which has an etch rate being different from that of said first material with respect to an anisotropic or isotropic etching is used as said second material.

15. A method for manufacturing a semiconductor memory device as claimed in claim 14, wherein said second material is a photoresist.

* * * * *